(12) United States Patent
Donaldson et al.

(10) Patent No.: US 10,271,451 B2
(45) Date of Patent: Apr. 23, 2019

(54) MOUNTING ASSEMBLIES FOR SUPPORTING CARD READERS IN ELECTRONIC EQUIPMENT RACKS, AND RELATED METHODS

(71) Applicant: MASTERCARD INTERNATIONAL INCORPORATED, Purchase, NY (US)

(72) Inventors: Glenn W. Donaldson, O'Fallon, MO (US); Doug W. Rawson, Edwardsville, IL (US); Tim J. Pisell, St. Peters, MO (US); Travis J. McClintock, St. Charles, MO (US)

(73) Assignee: MASTERCARD INTERNATIONAL INCORPORATED, Purchase, NY (US)

( * ) Notice: Subject to any disclaimer, the term of this patent is extended or adjusted under 35 U.S.C. 154(b) by 0 days.

(21) Appl. No.: 15/639,156

(22) Filed: Jun. 30, 2017

(65) Prior Publication Data

US 2019/0008068 A1    Jan. 3, 2019

(51) Int. Cl.
| | |
|---|---|
| *H05K 7/14* | (2006.01) |
| *A47B 88/483* | (2017.01) |
| *A47B 88/437* | (2017.01) |
| *A47B 88/497* | (2017.01) |
| *G06F 1/16* | (2006.01) |
| *A47B 88/95* | (2017.01) |
| *A47B 88/427* | (2017.01) |

(52) U.S. Cl.
CPC ......... *H05K 7/1489* (2013.01); *A47B 88/437* (2017.01); *A47B 88/483* (2017.01); *A47B 88/497* (2017.01); *G06F 1/16* (2013.01); *A47B 2088/4278* (2017.01); *A47B 2088/953* (2017.01)

(58) Field of Classification Search
CPC .. H05K 7/1489; H05K 7/1488; H05K 7/1491; A47B 88/197; A47B 88/483; A47B 88/437; A47B 2088/953; A47B 2088/4278; G06F 1/16; H04Q 1/13
USPC ...................................................... 211/26
See application file for complete search history.

(56) References Cited

U.S. PATENT DOCUMENTS

| | | | | |
|---|---|---|---|---|
| 4,712,232 A | * | 12/1987 | Rodgers ........... | H04Q 1/14 174/60 |
| 5,167,530 A | * | 12/1992 | Wallgren ........ | H01R 13/514 439/540.1 |
| 5,396,405 A | * | 3/1995 | Reed ............. | H04Q 1/025 174/668 |

(Continued)

*Primary Examiner* — Patrick D Hawn
(74) *Attorney, Agent, or Firm* — Harness, Dickey & Pierce, P.L.C.

(57) ABSTRACT

A mounting assembly is provided for supporting card readers in an electronic equipment rack, where the rack is configured to house therein the card readers and electronic equipment in communication with the card readers. The mounting assembly generally includes a bracket configured to couple to a frame of the rack, and at least one mount configured to couple to a card reader. The at least one mount is further configured to releasably couple to the bracket while the bracket is coupled to the frame of the rack to thereby position the card reader, when coupled to the at least one mount, in the rack. What's more, the bracket may be free of arms extending away from the bracket when the at least one mount is uncoupled from the bracket.

17 Claims, 13 Drawing Sheets

(56) References Cited

U.S. PATENT DOCUMENTS

| | | | | |
|---|---|---|---|---|
| 5,548,489 A * | 8/1996 | Reed | | H04Q 1/025 |
| | | | | 174/651 |
| 5,647,763 A * | 7/1997 | Arnold | | G02B 6/3897 |
| | | | | 439/532 |
| 5,658,166 A * | 8/1997 | Freeman | | H01R 13/518 |
| | | | | 439/49 |
| 5,980,324 A * | 11/1999 | Berg | | H01R 13/24 |
| | | | | 439/630 |
| 6,115,263 A * | 9/2000 | Babineau | | H05K 9/0016 |
| | | | | 174/382 |
| 6,170,784 B1 * | 1/2001 | MacDonald | | H05K 7/1448 |
| | | | | 211/26 |
| 6,307,750 B1 * | 10/2001 | Bendikas | | H05K 7/186 |
| | | | | 361/724 |
| 7,259,325 B2 * | 8/2007 | Pincu | | H04Q 1/02 |
| | | | | 174/50 |
| 7,437,048 B2 * | 10/2008 | Farrell | | G02B 6/4452 |
| | | | | 385/134 |
| 7,506,768 B2 * | 3/2009 | Rassmussen | | H05K 7/1425 |
| | | | | 211/183 |
| 7,782,625 B2 * | 8/2010 | Taylor | | H05K 7/1488 |
| | | | | 361/724 |
| 7,914,059 B2 * | 3/2011 | Carnevali | | B60R 11/02 |
| | | | | 296/24.34 |
| 7,959,015 B2 * | 6/2011 | Sempliner | | H05K 7/1488 |
| | | | | 211/26 |
| 8,040,693 B2 * | 10/2011 | Blomquist | | H04Q 1/02 |
| | | | | 174/481 |
| 8,052,231 B2 * | 11/2011 | Rasmussen | | H05K 7/1425 |
| | | | | 211/183 |
| 8,459,756 B2 * | 6/2013 | Linhares, Jr. | | H05K 7/20736 |
| | | | | 211/26 |
| 8,901,418 B2 * | 12/2014 | Walker | | H05K 5/0247 |
| | | | | 174/50 |
| 9,144,175 B2 * | 9/2015 | Segroves | | H05K 7/1491 |
| 9,456,520 B1 * | 9/2016 | Wilson | | H05K 7/1488 |
| 9,510,471 B2 * | 11/2016 | Segroves | | H05K 7/1491 |
| 2002/0171999 A1 * | 11/2002 | Huang | | G06F 13/409 |
| | | | | 361/600 |
| 2003/0123220 A1 * | 7/2003 | Huang | | G11B 33/122 |
| | | | | 361/679.33 |
| 2007/0099493 A1 * | 5/2007 | Niazi | | H01R 13/518 |
| | | | | 439/540.1 |
| 2008/0316702 A1 * | 12/2008 | Donowho | | H05K 7/20572 |
| | | | | 361/692 |
| 2009/0178985 A1 * | 7/2009 | Sempliner | | H05K 7/1461 |
| | | | | 211/26 |
| 2009/0179116 A1 * | 7/2009 | St-Louis | | G02B 6/4452 |
| | | | | 248/68.1 |
| 2009/0224110 A1 * | 9/2009 | Donowho | | H02G 3/0456 |
| | | | | 248/65 |
| 2009/0305554 A1 * | 12/2009 | Siano | | G02B 6/4452 |
| | | | | 439/540.1 |
| 2010/0068923 A1 * | 3/2010 | Tabet | | H01R 13/518 |
| | | | | 439/540.1 |
| 2010/0193754 A1 * | 8/2010 | Garza | | H02G 3/0456 |
| | | | | 254/134.3 CL |
| 2011/0073726 A1 * | 3/2011 | Bergesch | | H05K 7/183 |
| | | | | 248/201 |
| 2011/0211329 A1 * | 9/2011 | Dean, Jr. | | G02B 6/4459 |
| | | | | 361/826 |
| 2012/0229633 A1 * | 9/2012 | Boucino | | H05K 7/1495 |
| | | | | 348/143 |
| 2013/0342091 A1 * | 12/2013 | Walker | | H05K 5/0247 |
| | | | | 312/265.5 |
| 2014/0029198 A1 * | 1/2014 | Lozon | | G06F 1/16 |
| | | | | 361/679.57 |
| 2015/0102101 A1 * | 4/2015 | Hazzard | | H05K 7/1498 |
| | | | | 235/375 |
| 2016/0037919 A1 * | 2/2016 | Griffith | | H05K 5/0208 |
| | | | | 312/286 |
| 2018/0136692 A1 * | 5/2018 | Michael | | G07F 11/62 |

* cited by examiner

MOUNTING ASSEMBLIES FOR SUPPORTING CARD READERS IN ELECTRONIC EQUIPMENT RACKS, AND RELATED METHODS

FIELD

The present disclosure generally relates to mounting assemblies for supporting card readers in electronic equipment racks, and related methods, where the electronic equipment racks are configured to house, therein, the card readers and electronic equipment in communication with the card readers.

BACKGROUND

This section provides background information related to the present disclosure which is not necessarily prior art.

Computing systems are often used for servicing large groups of individuals, such as employees at companies, etc. In order to accommodate the workloads associated with or demanded by such individuals, the computing systems typically comprise a plurality of electronic equipment such as computer servers, telecommunications devices, etc. Usually, such equipment is located together at a particular location (e.g., in data center, a server room, etc.) for centralized administration, and is housed in standardized racks and rack-mountable equipment enclosures. In connection therewith, and in order to facilitate such administration, card readers are often housed with the equipment in the racks and are provided in communication with the equipment. In particular, the card readers are used to authenticate administrators or others when attempting to access the equipment for maintenance or otherwise.

As indicated above, the racks used to house the electronic equipment associated with the computing systems are typically constructed based on certain industry standards (for example, in accordance with standards implemented by the Electronic Industries Alliance (EIA)) to ensure uniformity and compatibility of the racks and corresponding rack-mounted devices included therein. For instance, a standardized "19-inch" rack may require each the vertical rail included therein to be generally square in section and to have a width dimension of 0.625 inches (15.88 mm), and may require a spacing between adjacent vertical rails to be 17.75 inches (450.85 mm). As such, an overall width of the rack may be 19 inches (482.60 mm), when measured from an outer edge of one vertical rail to an outer edge of the adjacent vertical rail of the rack. In connection therewith, and as part of such standardization, rack-mountable devices (such as brackets, shelves, drawers, etc.) to be used in the 19-inch rack typically have a width dimension of 19 inches, and a height dimension that is some integer or multiple of 1.75 inches (44.45 mm) (or that is some multiple of one unit length ("1U")). Thus, a 1U mounting bracket has a height of 1.75 inches, while a 2U server has a height (or potentially a width) of 3.5 inches, and so forth.

With that said, FIGS. 1 and 2 illustrate a typical, prior art equipment rack 1 (for example, a 19-inch rack). The equipment rack 1 includes a frame 3, comprising multiple vertical rails 5 and multiple horizontal rails 7 for use in mounting individual equipment in the rack 1. In particular in the rack 1, mounts 9 are coupled to the forward vertical rails 5 (via openings in the rails 5) to hold servers/telecommunications devices 11 in the rack 1 and a support bracket 13 is coupled to the adjacent forward vertical rails 5 to hold card readers 15 in the rack 1 (FIG. 1). The card readers 15 are then connected to the servers/telecommunications devices 11 via cords 17 extending, behind the bracket 13, from rear portions of the card readers 15 to the servers/telecommunications devices 11 (FIG. 2). With additional reference to FIG. 3, the support bracket 13 includes four pairs of integral arms 19 (i.e., eight total arms 19) extending away from a rearward portion of the bracket 13 (in a vertically alternating configuration such that an arm 19 of one pair is vertically aligned with an arm 19 of an adjacent pair). As such, the support bracket 13 is configured to hold four of the card readers 15 in the rack 1, with each of the card readers 15 positioned between one of the pairs of arms 19. In so doing, card slots 21 of the card readers 15 are aligned with (and are accessible through) forward openings 23 of the bracket 13. However, the bracket openings 23 are generally smaller in size than the overall dimensions of the card readers 15, such that the card readers 15 may not be able to slide through the openings 23 (the openings 23 are typically configured to only allow access to the card slots 21). Accordingly, in order to position the card readers 15 in the rack 1, the card readers 15 are typically coupled to the support bracket 13 first, and the support bracket 13 is then coupled to the vertical rails 5 of the rack 1.

DRAWINGS

The drawings described herein are for illustrative purposes only of selected embodiments and not all possible implementations, and are not intended to limit the scope of the present disclosure.

Corresponding reference numerals indicate corresponding parts throughout the several views of the drawings.

DETAILED DESCRIPTION

Exemplary embodiments will now be described more fully with reference to the accompanying drawings. The description and specific examples included herein are intended for purposes of illustration only and are not intended to limit the scope of the present disclosure.

Figure 1:
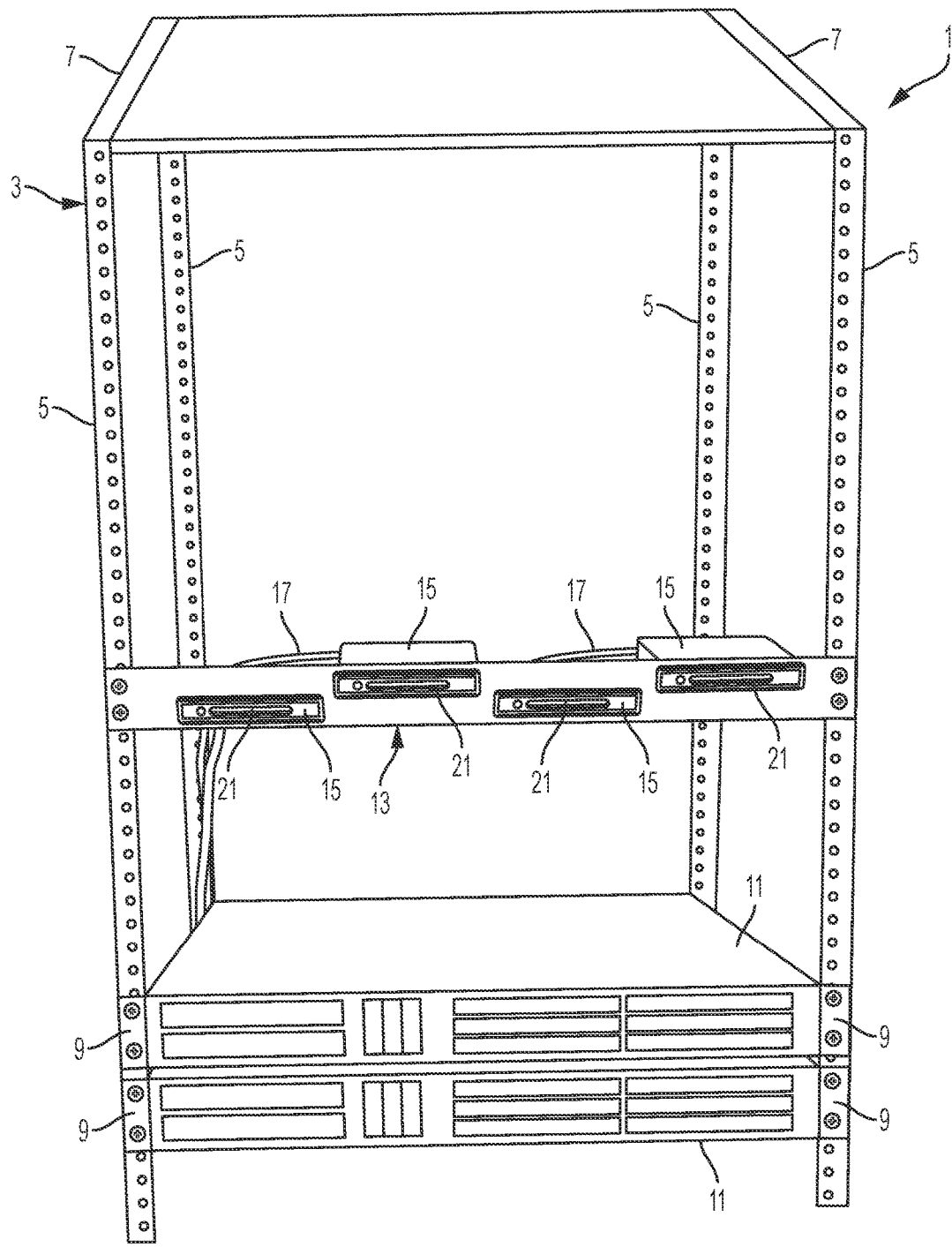
FIG. 1 is a perspective view of an electronic equipment rack for housing electronic equipment therein, including multiple servers/telecommunications devices and multiple card readers in communication therewith, where the card readers are supported in the equipment rack via a prior art support bracket.
Figure 2:
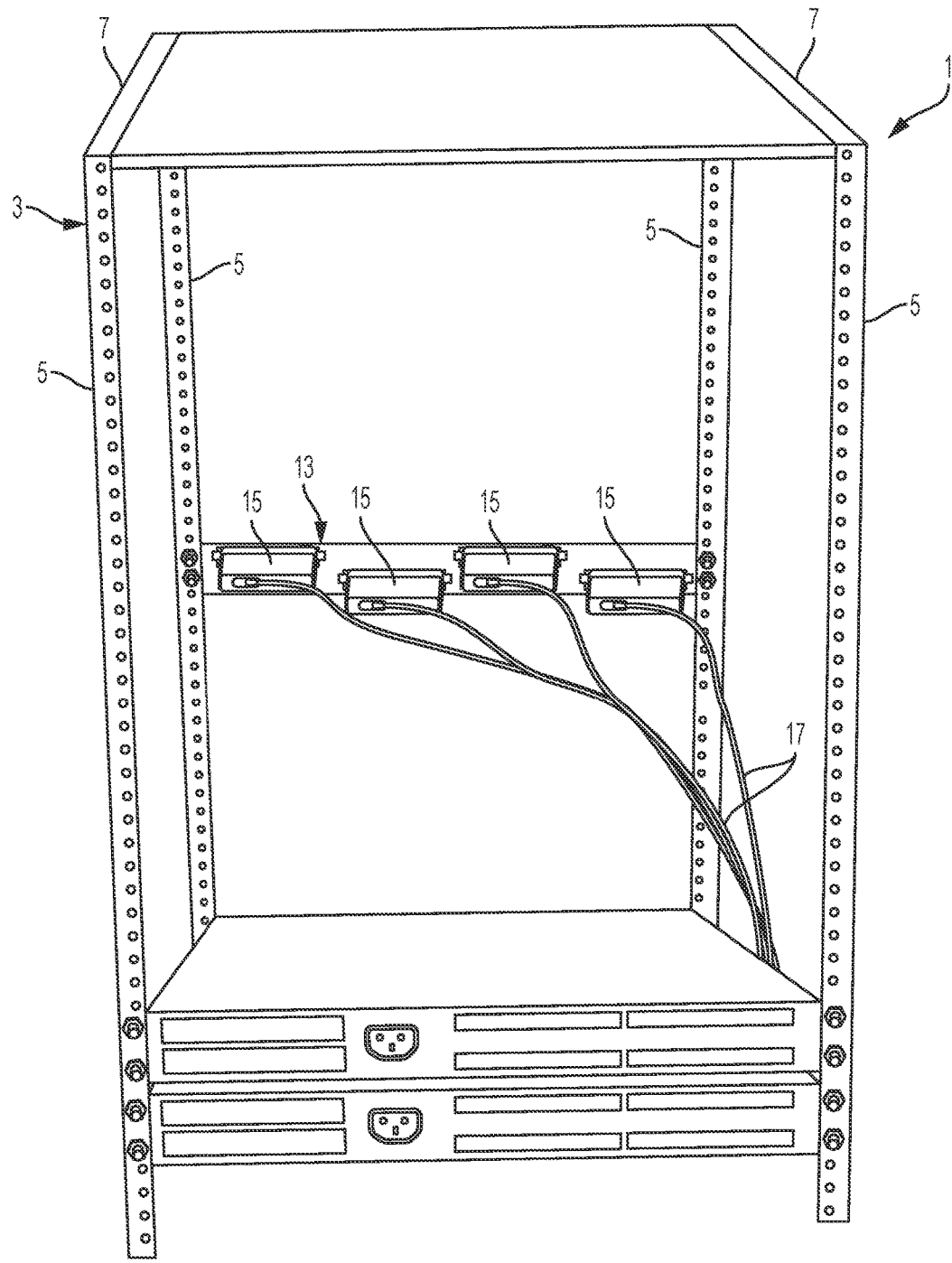
FIG. 2 is a rear elevation view of the equipment rack of FIG. 1.
Figure 3:
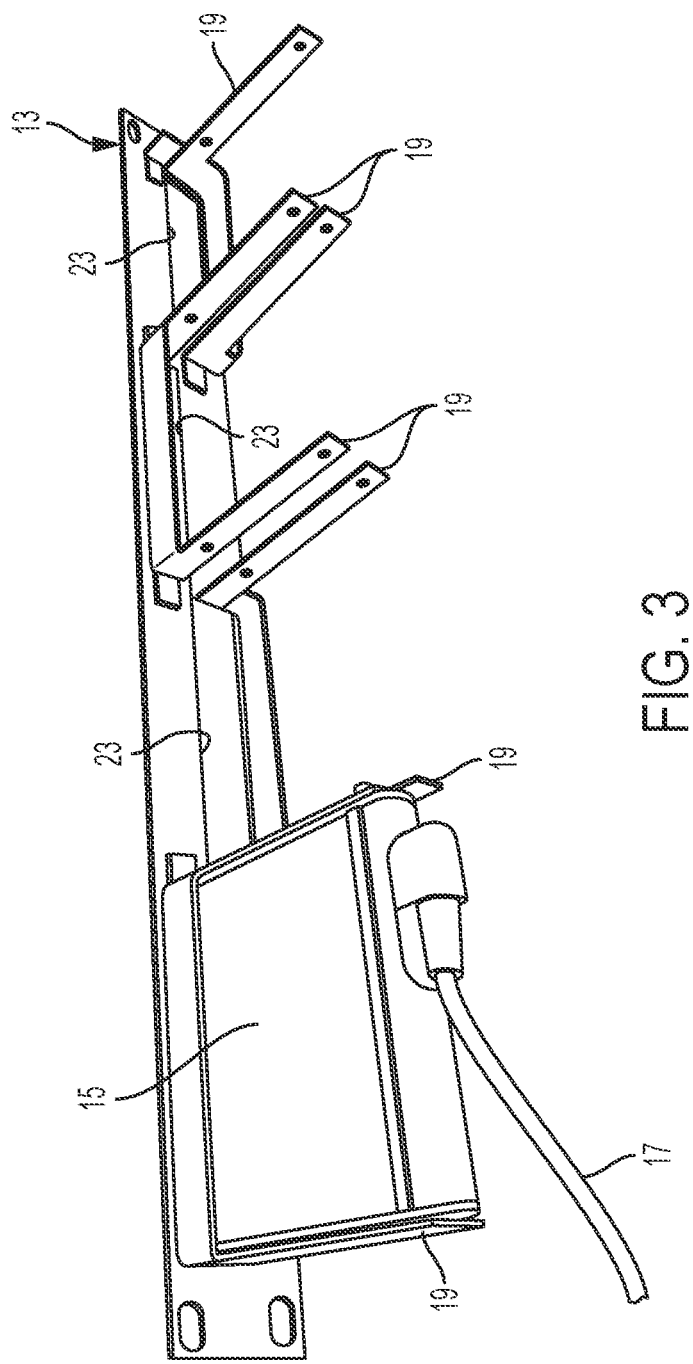
FIG. 3 is a rearward perspective view of the prior art support bracket from the equipment rack of FIG. 1, shown removed from the rack and having one card reader positioned therein.

Electronic equipment may be used in computing systems for servicing large groups of users. In connection therewith, the electronic equipment is often housed in standardized racks for centralized administration (e.g., in server rooms, telecommunication rooms, etc.). Card readers may be incorporated into the standardized racks, to facilitate secure access to the equipment when necessary (e.g., to facilitate authentication of administrators or others attempting to access the equipment within the racks, etc.). However, conventional support brackets (as shown in FIGS. 1-3) used to position the card readers in the equipment racks must be removed from, or uncoupled from, the racks in order to couple the card readers to arms thereof. Or, if already coupled to the equipment racks, rearward sides of the brackets must be accessible in order to couple the card readers to the arms (which, often, is not the case because the rearward sides of the brackets are typically blocked by equipment positioned in the equipment racks).

Uniquely, the mounting assemblies herein include brackets and separate mounts that allow for installing and/or removing card readers to/from electronic equipment racks from forward sides of the brackets while the brackets are coupled to (and remain coupled to) the equipment racks. As such, the brackets herein need not be removed from the equipment racks, nor do rearward sides of the installed brackets need to be accessible, in order to add card readers to the brackets (and racks) or remove card readers therefrom (as is conversely required for conventional brackets, such as support bracket 13 of FIGS. 1-3).

With reference now to the drawings, FIGS. 4-14 illustrate an exemplary embodiment of a bracket 100 and corresponding card reader mounts 102*a-b* (together, broadly a mounting assembly) according to, and including one or more aspects of, the present disclosure. As will be described, the mounting assembly (comprising the bracket 100 and the separate card reader mounts 102*a-b*) may be used to support one or more card readers in an electronic equipment rack and in communication with various electronic equipment included in the rack.

Figure 4:
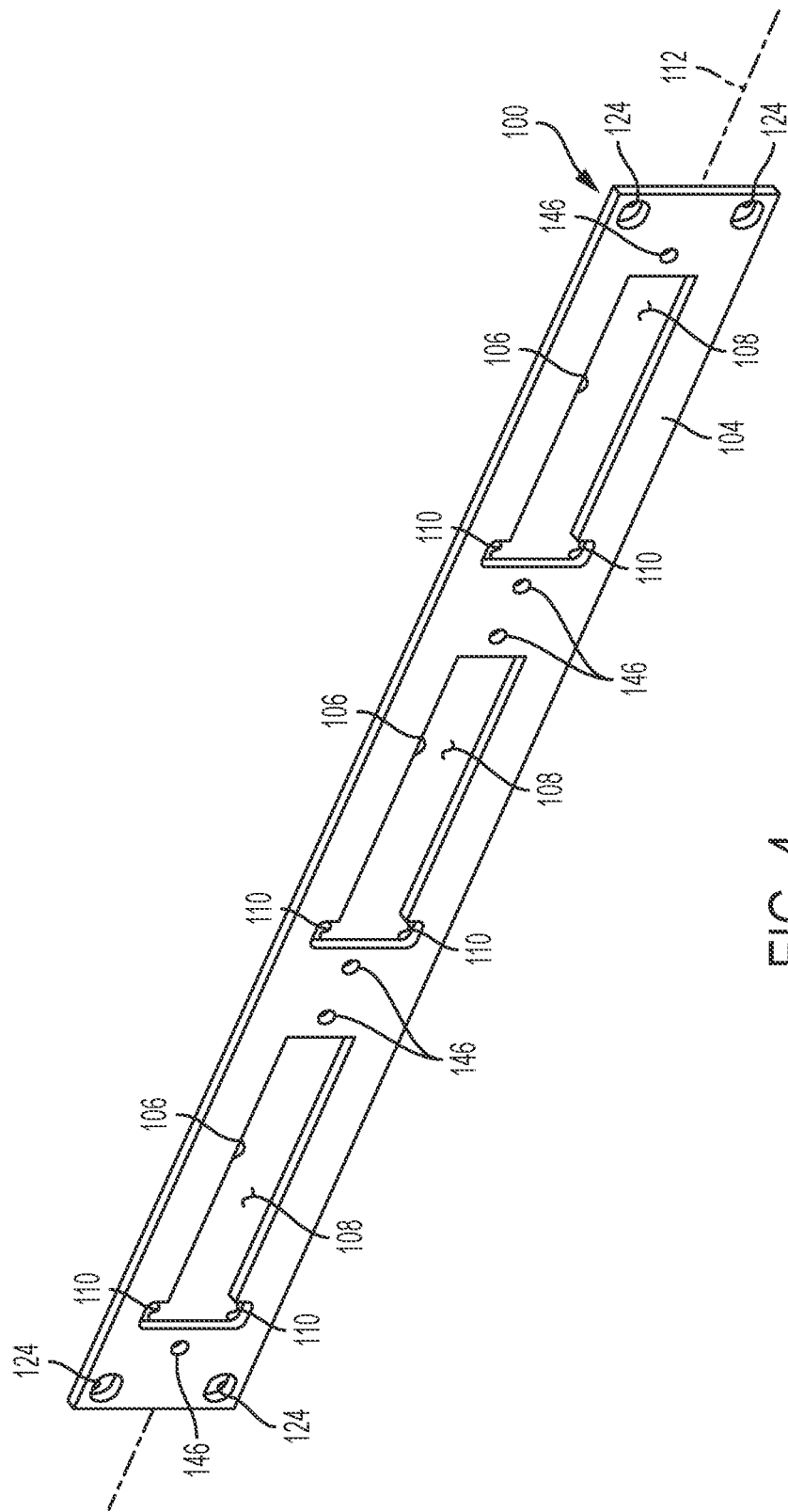
FIG. 4 is an isometric view of an exemplary embodiment of a mounting bracket according to the present disclosure.
Figure 5:
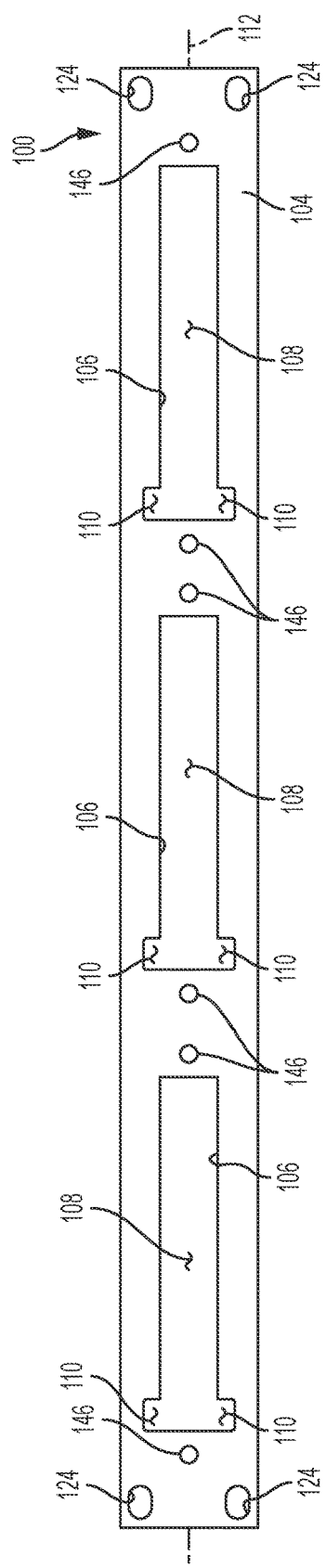
FIG. 5 is a front elevation view of the mounting bracket of FIG. 4.
Figure 6:
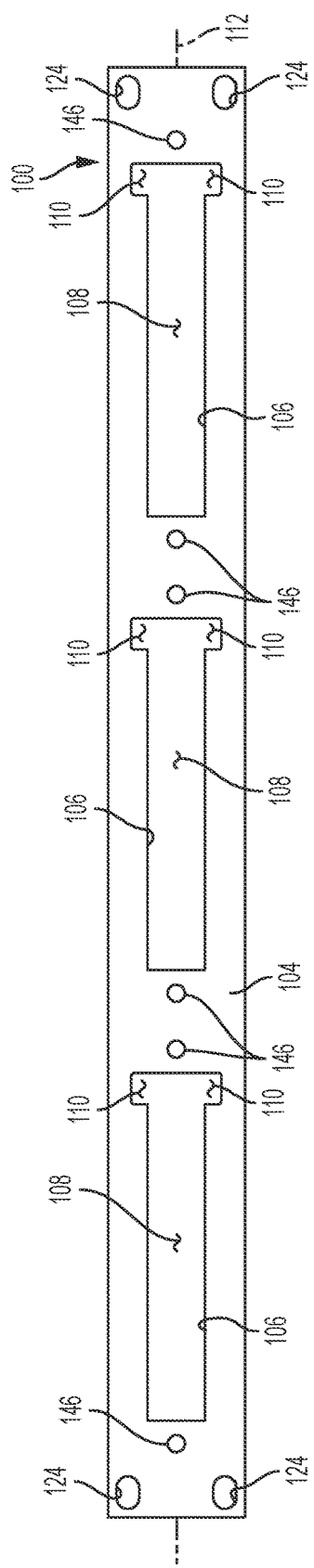
FIG. 6 is a rear elevation view of the mounting bracket of FIG. 4.

As shown in FIGS. 4-6, the illustrated bracket 100 (of the mounting assembly) includes a body 104 having a generally rectangular shape and a generally planar construction. In addition, the illustrated bracket 100 is free of (and does not include) any structures (e.g., integral mounting arms, etc.) extending or protruding away from the body 104 that would be used to couple a card reader to the bracket 100 (and in particular from a rearward (or rearward facing) portion of the body 104, as is typical in conventional support brackets). In particular, this is the case for the bracket 100 when the mounts 102*a-b* are selectively uncoupled from the body 104 of the bracket 100.

The illustrated bracket 100 is also configured for use with a standard 19-inch electronic equipment rack. As such, the bracket 100 generally includes a width dimension of about 19 inches. What's more, the bracket 100 includes a height dimension of about 1.75 inches (or 1U). However, in other exemplary embodiments, the bracket 100 may include a height dimension of about 3.5 inches (or 2U), a height dimension of about 5.25 inches (or 3U), etc. With that said, it should be appreciated that the bracket 100 may include other configurations (e.g., other shapes, other constructions, other sizes, other configurations with one or more structures extending away from the bracket 100, etc.) in other exemplary embodiments. For example, the bracket 100 may include a width dimension of other than 19 inches for use in racks that are other than 19-inch racks, etc. In particular, the bracket 100 may include a width dimension whereby the bracket 100 may be used in a European Telecommunications Standards Institute (ETSI) rack having a width dimension of about 21 inches (whereby the bracket 100 may have a width dimension of about 21 inches), or in a 23-inch telecommunications rack (whereby the bracket 100 may have a width dimension of about 23 inches), or in any other desired rack, etc.

The illustrated bracket 100 further defines three generally English-alphabetic T-shaped openings 106 extending generally longitudinally along a width of the bracket 100. Each opening includes a slot portion 108 and two cove portions 110. And, in particular, the slot portions 108 of the openings 106 are generally aligned and extend along a longitudinal axis 112 of the bracket 100 (generally widthwise along the bracket 100). As will be described, the slot portion 108 of each of the openings 106 is configured to receive a card reader there though (for installation of the card reader to the bracket 100), and one of the two cove portions 110 is then configured to receive a cord associated with the card reader from behind the card reader and through the given opening 106. In the illustrated embodiment, the cove portions 110 of the openings 106 are disposed toward left sides of the openings 106 (when viewing a forward portion of the bracket 100 such as in FIGS. 4 and 5). However, it should be appreciated that in other embodiments the cove portions 110 of the openings 106 could alternatively be located toward right sides of the openings 106 (again when viewing a forward portion of the bracket 100), or the cove portions 110 of the openings 106 could be located at any desired locations between left and right sides of the openings 106. In addition, it should be appreciated that the bracket 100 may define a number of openings other than three in various other embodiments, for example, depending on a size of the bracket 100, on a size of a rack in which the bracket 100 is intended to be used (e.g., an ETSI rack, a 23-inch telecommunications rack whereby four such openings 106 may then be included in the bracket 100, etc.), etc. (e.g., one opening, at least one opening, two openings, four openings, etc.). Still further, it should be appreciated that the bracket 100 may define openings having other shapes, for example, openings comprising slot portions without cove portions, English-alphabetic L-shaped openings (whereby the openings may define a slot portion and a single cove portion), etc.

Figure 7:
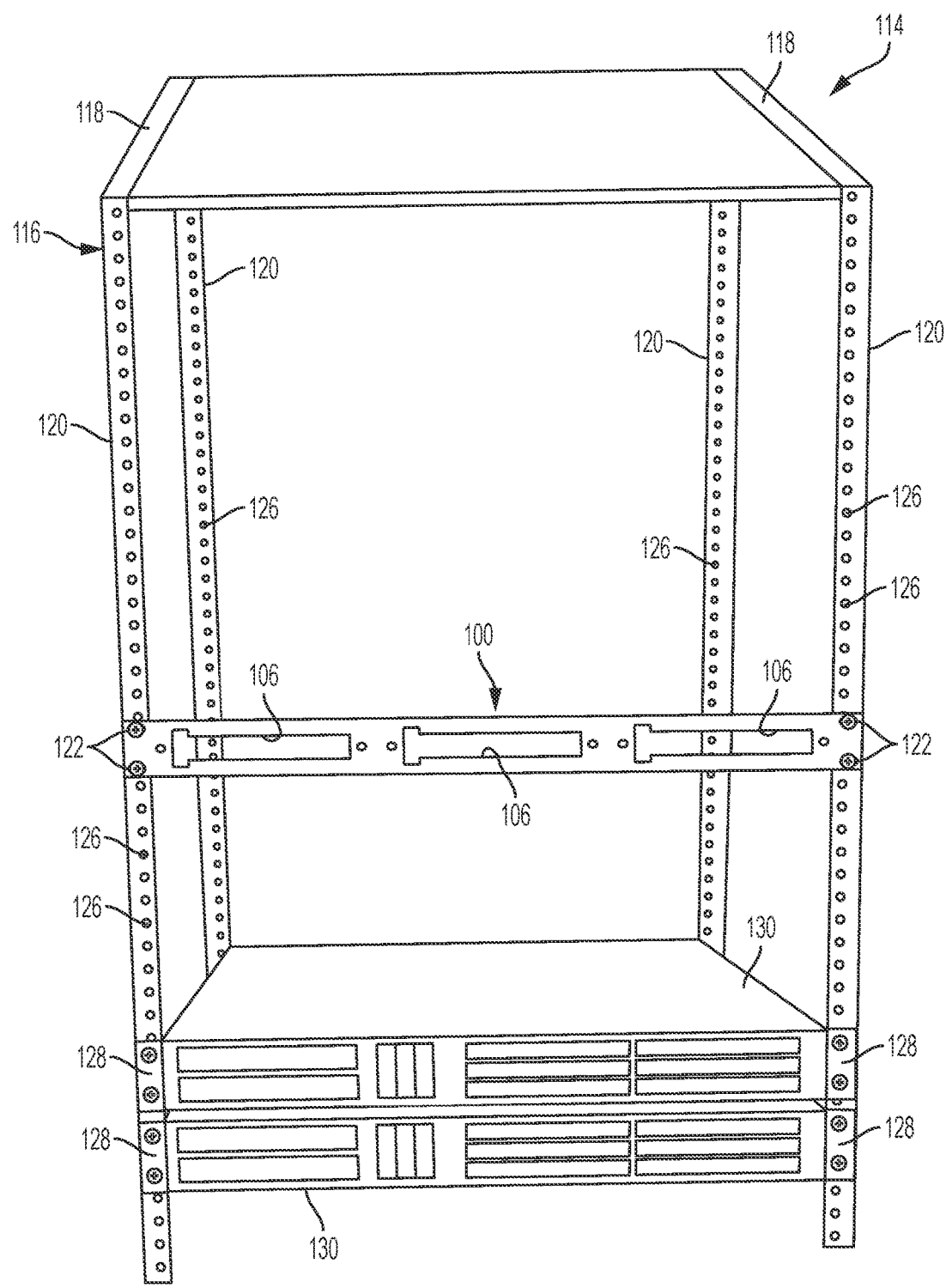
FIG. 7 is a perspective view of an electronic equipment rack for housing electronic equipment therein, and including multiple servers/telecommunications devices and the mounting bracket of FIG. 4 shown installed in the rack.
Figure 13:
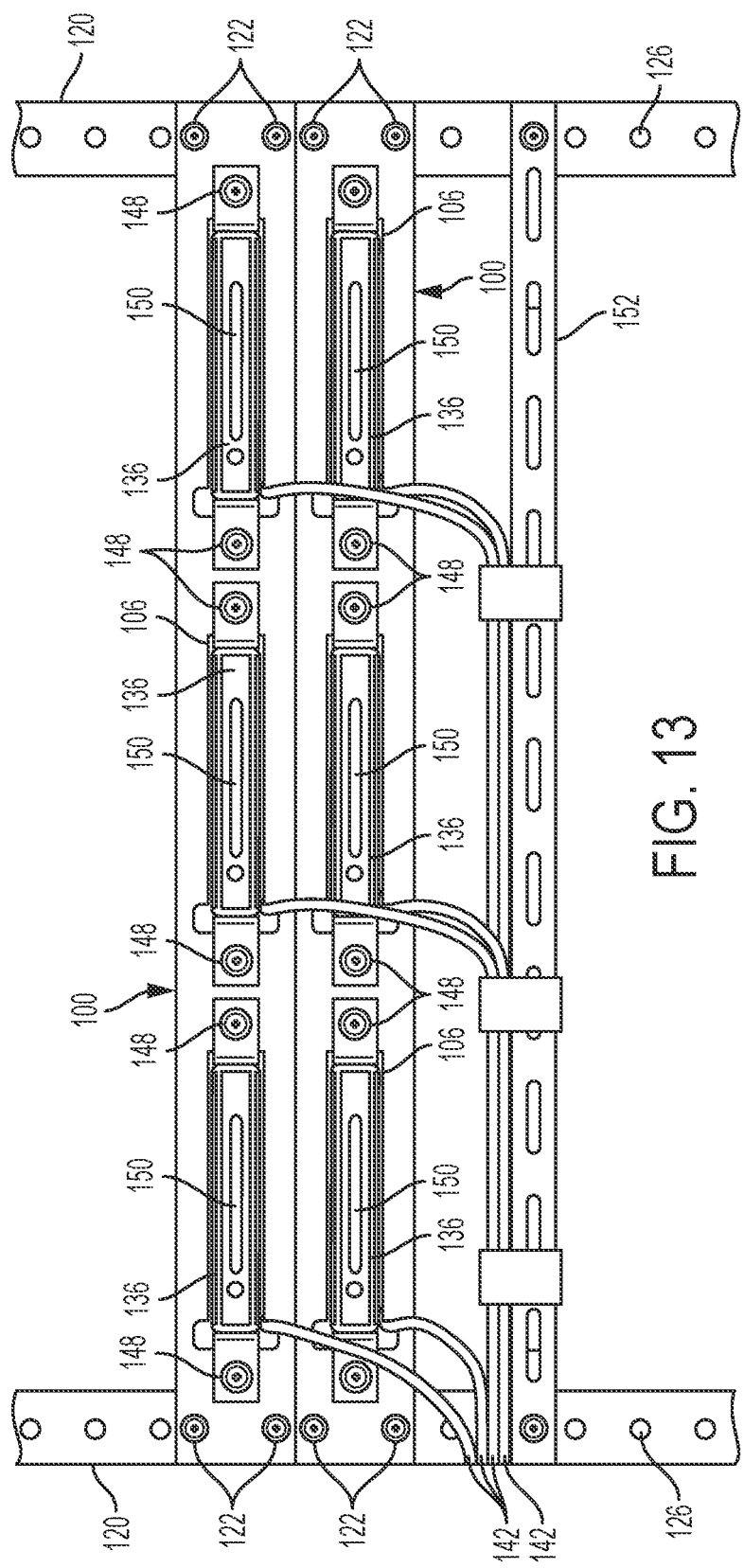
FIG. 13 is a front elevation view of a fragmentary portion of the electronic equipment rack of FIG. 7, with card readers shown installed to the mounting bracket therein and with an additional mounting bracket shown installed in the rack with card readers shown supported therein.
Figure 14:
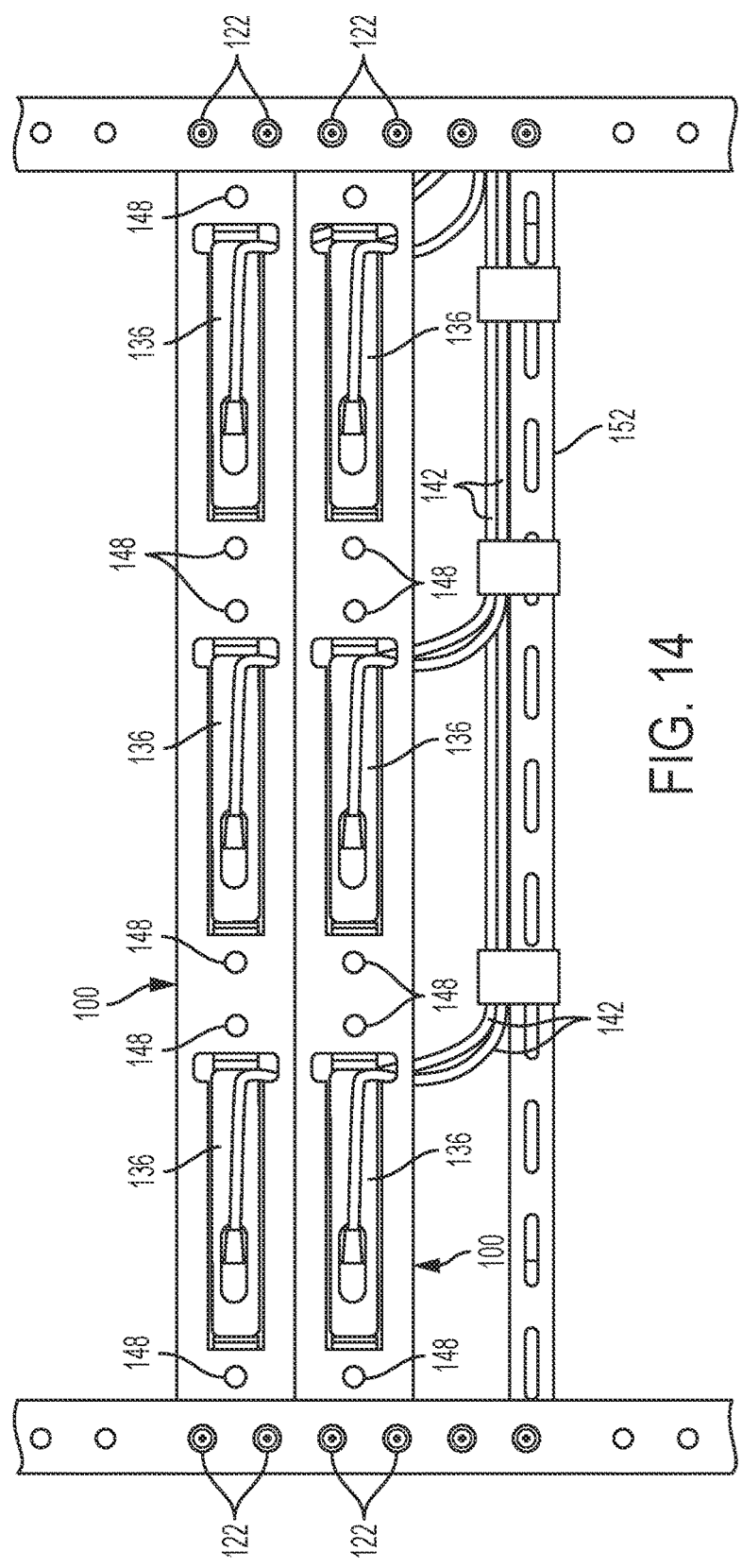
FIG. 14 is a rear elevation view of the fragmentary portion of the equipment rack shown in FIG. 13.

FIG. 7 illustrates an exemplary equipment rack 114 (e.g., a standard 19-inch rack, etc.) in which the bracket 100 can be installed. The rack 114 generally includes a frame 116 having multiple horizontal rails 118 and multiple vertical rails 120 thereby defining the rack 114. In the illustrated embodiment, the bracket 100 is coupled to two adjacent ones of the forward vertical rails 120 of the rack frame 116, and extends there between (with a rearward surface portion of the bracket 100 generally engaging the vertical rails 120). In particular, fasteners 122 (e.g., screws, bolts, etc.) are positioned through mounting openings 124 of the bracket 100 and through corresponding openings 126 in the vertical rails 120 to thereby couple the bracket 100 to the rails 120 (and thus the rack 114). Also in the illustrated embodiment, mounts 128 are coupled to the forward vertical rails 120 generally below the bracket 100, and are used to position servers/telecommunications devices 130 in the rack 114. It should be appreciated that other equipment may additionally (or alternatively) be included in the rack 114 and coupled to the rails 118, 120 of the rack 114 and/or supported by structure coupled thereto (e.g., other support structures such as other or additional brackets, shelves, drawers, chassis, etc.; computing equipment such as additional servers, etc.; etc.). It should be appreciated that additional ones of the bracket 100 may also be coupled to the vertical rails 120 of the rack frame 116 (for example, such as shown in FIGS. 13 and 14).

Figure 8:
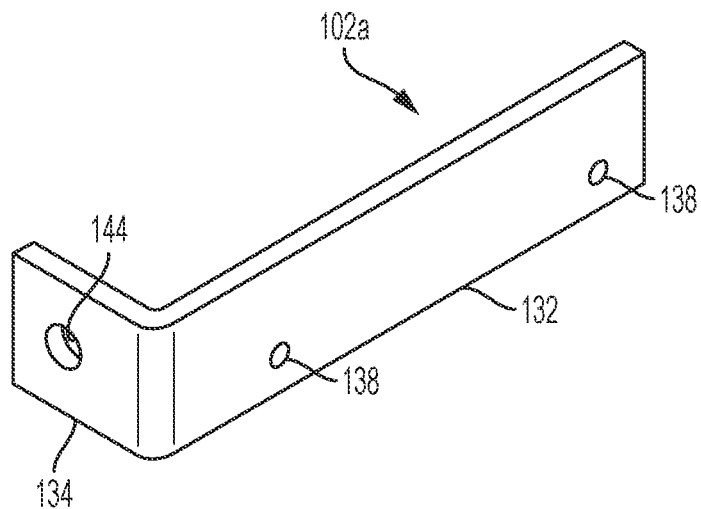
FIGS. 8 and 9 are isometric views of mounts for use in coupling a card reader to the mounting bracket of FIG. 4.
Figure 9:
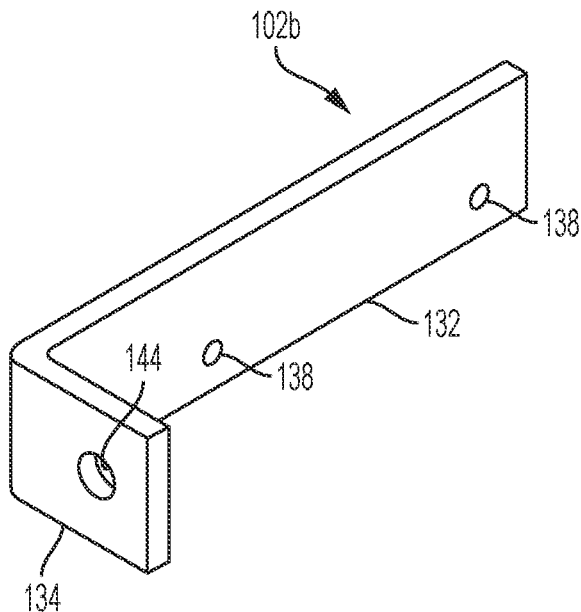
Figure 10:
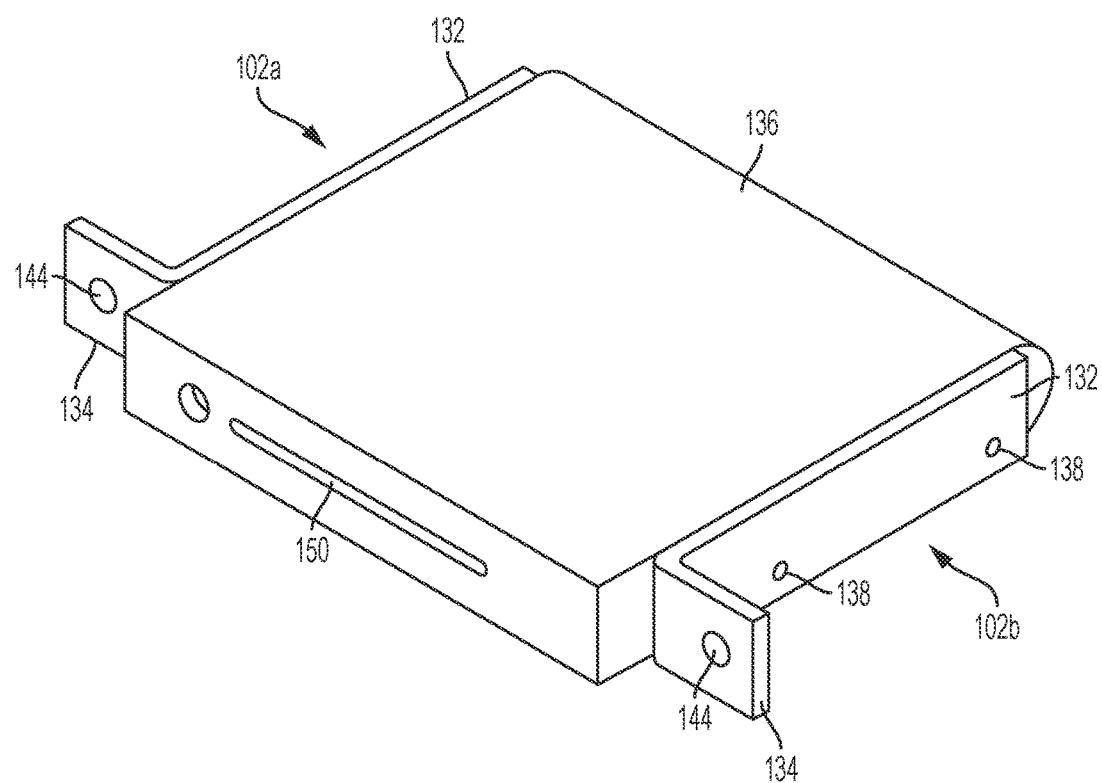
FIG. 10 is an isometric view of the mounts of FIGS. 8 and 9 shown coupled to the card reader.

Referring now to FIGS. 8-10, first and second ones of the card reader mounts 102a-b (of the mounting assembly) are shown. Each of the first and second mounts 102a-b includes an arm 132 and a flange 134 extending away from the arm 132 (generally perpendicularly in the illustrated embodiment). And, as shown in FIG. 10, the first and second mounts 102a-b are configured to couple to opposite sides of a card reader 136 (e.g., the first mount 102a is configured to couple to a left side of the card reader 136 and the second mount 102b is configured to couple to a right side of the card reader 136, etc.), whereby the mounts 102a-b may then be used to install the card reader 136 to the bracket 100 (as described hereinafter). In particular, openings 138 defined in the arm 132 of each of the mounts 102a-b are configured to align with corresponding openings (not visible) in a side portion of the card reader 136. Fasteners (e.g., a threaded fastener such as a screw, etc.; a friction fit fastener; etc.) (not shown) may then be positioned through the aligned arm openings 138 and card reader openings to couple the mounts 102a-b to the card reader 136 (thereby also providing an operation of coupling the mounts 102a-b to the card reader 136). In the illustrated embodiment, the arms 132 of the mounts 102a-b each include two openings 138 for use in coupling the mounts 102a-b to the card reader 136. It should be appreciated, though, that the arms 132 may include any desired number of such openings 138 in other embodiments. What's more, it should be appreciated that other means may be used to couple the mounts 102a-b to the card reader 136, for example, snap-fit couplings, friction-fit couplings, integral pins (or other protrusions) associated with the mounts 102a-b and/or the card reader 136, etc.

Figure 11:
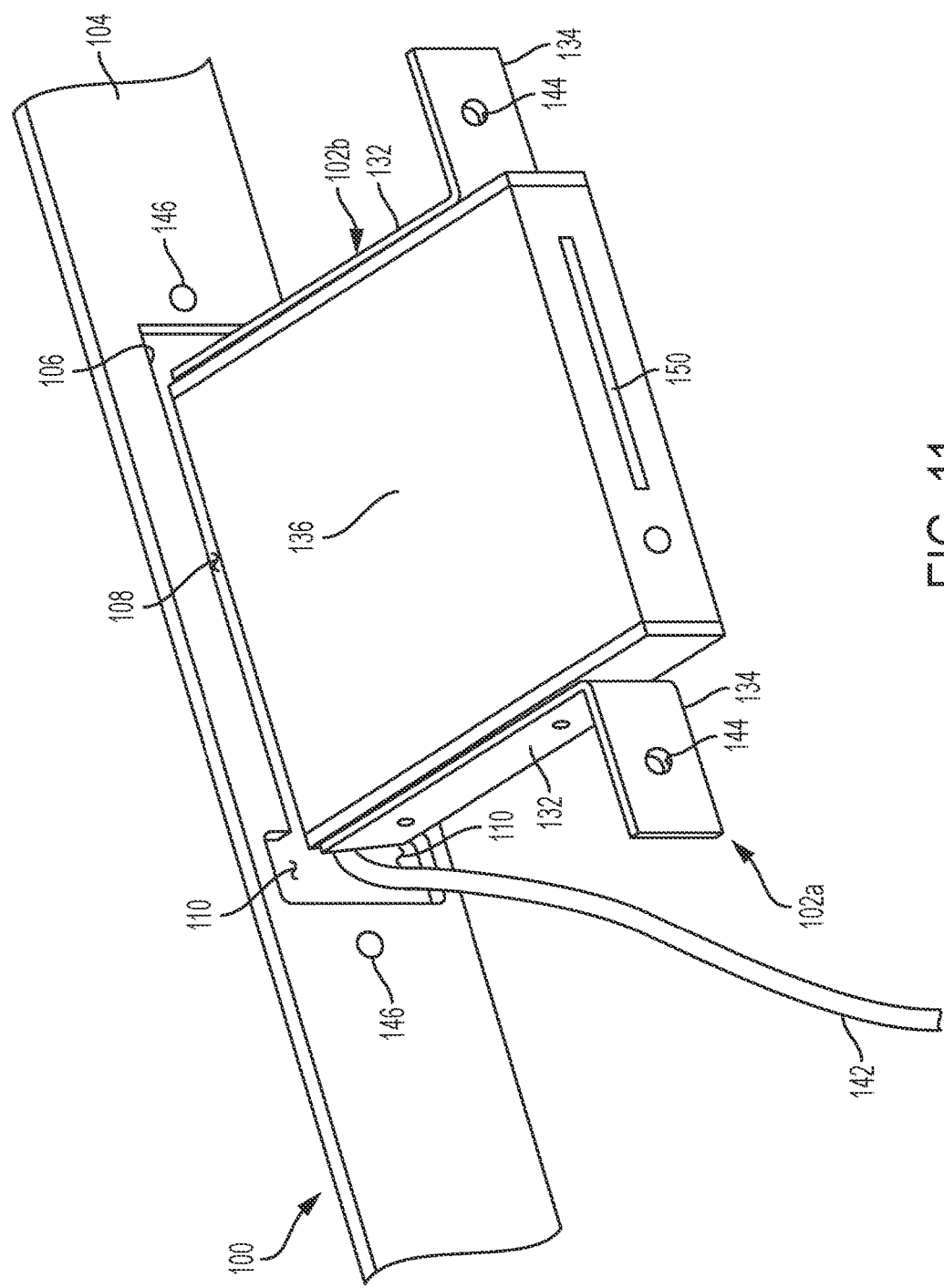
FIGS. 11 and 12 are enlarged isometric views of the mounting bracket of FIG. 4 illustrating installation of the card reader of FIG. 10 to the mounting bracket via one of multiple card reader openings of the mounting bracket.
Figure 12:
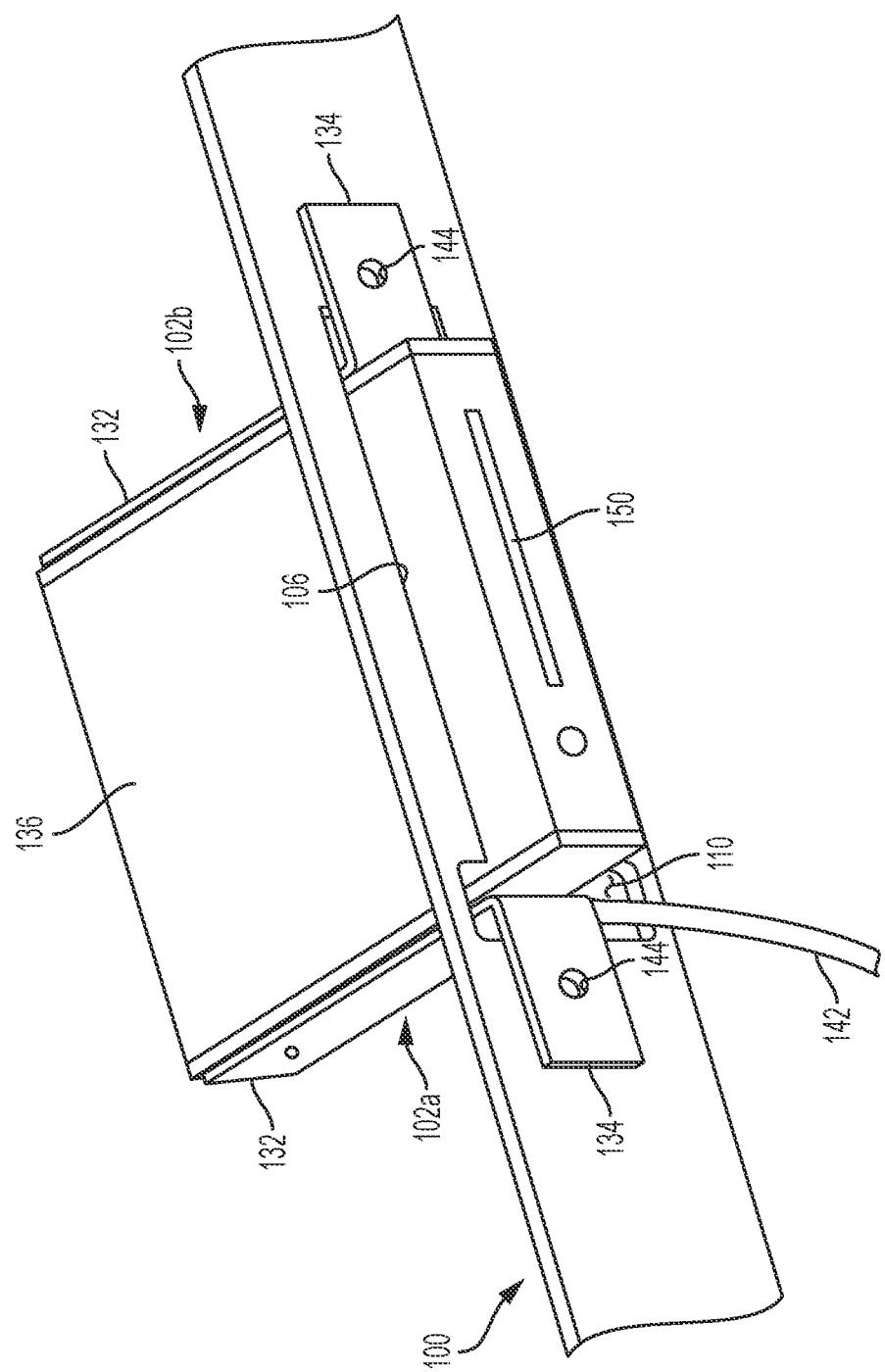

FIGS. 11 and 12 illustrate an example operation of installing the card reader 136 (with the first and second card reader mounts 102a-b coupled thereto) to the bracket 100. As shown, a back (or rearward) portion of the card reader 136 is initially aligned with the slot portion 108 of the opening 106. At the same time (or earlier or later), a cord 142 associated with the card reader 136 is positioned in alignment with one of the cove portions 110 of the opening 106 (e.g., the cord 142 may be positioned to the side of the card reader 136 and aligned with the lower cove portion 110, as shown in FIGS. 11 and 12).

Then in the operation, the card reader 136 and the first and second mounts 102a-b are moved (e.g., slid, etc.) through the slot portion 108 until the flange 134 of each of the first and second mounts 102a-b engages (e.g., is flush against, etc.) a forward (or forward facing) surface portion of the bracket 100. In connection therewith, an opening 144 of the flange 134 of each of the first and second mounts 102a-b is generally aligned with a corresponding mounting hole 146 of the bracket 100 (as located adjacent the opening 106 through which the card reader 136 and first and second mounts 102a-b are positioned, wherein one mounting hole 146 is located toward each of the left and right sides of opening 106 of the bracket 100). And, a fastener 148 (see, FIGS. 13 and 14) (e.g., a threaded fastener such as a screw or bolt, etc.) is positioned through each aligned opening 144 and mounting hole 146 to releasably couple (and ultimately install) the first and second mounts 102a-b (and, thus, the card reader 136) to the bracket 100. It should be appreciated that the bracket 100 may include different configurations of mounting holes 146 in other embodiments for facilitating attachment of each of the mounts 102a-b to the bracket 100 (e.g., at least one mounting hole, two mounting holes, etc.) and/or other means for facilitating such attachment (e.g., clips, friction fit connectors, etc.).

Finally, when the card reader is ultimately installed to the bracket 100, the card reader 136 and the first and second mounts 102a-b, as well as the cord 142 of the card reader 136, are positioned (and received) generally within, and generally extend through, the opening 106 of the bracket 100. In connection therewith, the cord 142 extends from generally behind the bracket 100 and extends outwardly through the opening 106 in a generally forward manner of the bracket 100. When desired to remove the card reader 136 from the bracket 100, the fasteners 148 may be removed from the mount openings 144 and bracket mounting holes 146 (e.g., unscrewed, etc.) and the card reader 136 may be moved out of the opening 106 of the bracket 100 (all while the bracket 100 remains coupled to the frame 116 of the equipment rack 114 and without having to access a rearward side of the bracket 100 within the rack 114).

FIGS. 13 and 14, in turn, illustrate a fragmentary portion of the equipment rack 114 of FIG. 7, with two of the brackets 100 shown coupled to the vertical rails 120 of the rack 114 and with three card readers 136 installed to, and supported by, each of the brackets 100 (where each of the card readers 136 are installed to the respective bracket 100 through one of the openings 106 using associated card reader mounts 102a-b, as described above). In addition, a horizontal member 152 is provided for directing the cords 142 of the card readers 136) through the equipment rack 114.

As shown, for each bracket 100 in the rack 114, the three card readers 136 installed in the bracket 100 are each generally aligned in the bracket 100 horizontally, along the longitudinal axis 112 of the bracket 100. In addition, for each of the installed card readers 136, the cord 142 of the given card reader 136 extends from the card reader 136 (from generally behind the bracket 100) and through the opening 106 (in particular, through the cove portion 110 of the given opening 106) in which the card reader 136 is disposed so that the cord 142 is accessible from a front portion of the bracket 100 for coupling to a desired one (or more) of the servers/telecommunications devices 130 in the rack 114. As such, the cord 142 is accessible as needed without having to remove the bracket 100 from the equipment rack 114 and without having to access a rear portion of the bracket 100 and/or equipment rack 114. And, one or more of the card readers 136 can be removed from the rack 114 by simply removing the particular one or more of the card readers 136, individually (as described above), without removing (or uncoupling) the entire bracket 100 (and other card readers 136 therein) from the rack 114. Instead, the mounts 102a-b associated with the particular one or more of the card readers 136 to be removed are simply uncoupled from the bracket 100 to thereby remove the card reader 136 (without interrupting access to and/or use of the other card readers 136 in the bracket 100). What's more, card slots 150 of the card readers 136 are also accessible at a forward portion of the rack 114 (and from a forward side of the bracket 100), as desired, whereby an administrator, for example, may insert an identification card into the card slot 150 of one of the card readers 136 in order to access a corresponding one or more of the servers/telecommunications devices 130 in the rack 114 (which are in communication with the given card reader 136).

With that said, in the illustrated mounting assembly two card reader mounts 102*a-b* are used to couple each of the card readers 136 to the bracket 100. As such, in the illustrated embodiment, six total mounts (with each pair of the mounts designated 102*a-b*) are used to couple the three card readers 136 to the bracket 100. It should be appreciated, however, that in other embodiments mounting assemblies may include utilize different numbers of mounts to couple card readers to brackets (e.g., one mount, at least one mount, three mounts, etc.). It should also be appreciated that the components of the mounting assembly (e.g., the bracket 100, the mounts 102*a-b*, etc.) may be constructed from suitable materials, for example, steel, aluminum, etc.

As can be seen from the above, mounting assemblies of the present disclosure (including the brackets and the selectively removable card reader mounts coupled thereto) provide an improved ability to install and access card readers in electronic equipment racks. In particular, for example, the brackets and mounts allow for installing and/or removing card readers to/from the racks from forward sides of the brackets, while the brackets are coupled to (and remain coupled to) the racks. As such, the brackets herein need not be removed from the equipment racks, nor do rearward sides of the installed brackets need to be accessible, in order to add card readers thereto or remove card readers therefrom. Also herein, in connection with use of the brackets in standard 19-inch electronic equipment racks, the brackets include three longitudinally aligned openings such that the brackets are capable of supporting three card readers when installed in the racks (as compared to four card readers for conventional brackets, such as bracket 13 shown in FIGS. 1-3). In connection therewith, the flanges of the mounts used to hold the card readers in the brackets are positioned adjacent the openings, such that only the three openings may be included in the brackets, for example, when the brackets are configured for use in the standard 19-inch electronic equipment racks. However, the brackets may comprise shorter heights than conventional brackets (which include openings at different vertical spacings, such as in the bracket 13 shown in FIGS. 1-3), and may also potentially be stacked (with one bracket mounted in a rack immediately above another bracket) to thereby accommodate a larger number of card readers when needed.

The foregoing description of the embodiments has been provided for purposes of illustration and description. It is not intended to be exhaustive or to limit the invention. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the invention, and all such modifications are intended to be included within the scope of the invention.

Example embodiments have been provided so that this disclosure will be thorough, and will fully convey the scope to those who are skilled in the art. Numerous specific details are set forth such as examples of specific components, assemblies, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

Specific dimensions, specific materials, and/or specific shapes disclosed herein are example in nature and do not limit the scope of the present disclosure. The disclosure herein of particular values and particular ranges of values for given parameters are not exclusive of other values and ranges of values that may be useful in one or more of the examples disclosed herein. Moreover, it is envisioned that any two particular values for a specific parameter stated herein may define the endpoints of a range of values that may be suitable for the given parameter (i.e., the disclosure of a first value and a second value for a given parameter can be interpreted as disclosing that any value between the first and second values could also be employed for the given parameter). For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, and 3-9.

The terminology used herein is for the purpose of describing particular example embodiments only and is not intended to be limiting. As used herein, the singular forms "a", "an" and "the" may be intended to include the plural forms as well, unless the context clearly indicates otherwise. The terms "comprises," "comprising," "including," and "having," are inclusive and therefore specify the presence of stated features, integers, steps, operations, elements, components, and/or groups thereof, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on", "engaged to", "connected to" or "coupled to" another element or layer, it may be directly on, engaged, connected or coupled to the other element or layer, or intervening elements or layers may be present. In contrast, when an element is referred to as being "directly on," "directly engaged to", "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, seeds, members and/or sections, these elements, components, seeds, members and/or sections should not be limited by these terms. These terms may be only used to distinguish one element, component, seed, member or section from another element, component, seed, member or section. Terms such as "first," "second," and other numerical terms when used herein do not imply a sequence or order unless clearly indicated by the context. Thus, a first element, component, seed, member or section discussed below could be termed a second element, component, seed, member or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

None of the elements recited in the claims are intended to be a means-plus-function element within the meaning of 35 U.S.C. § 112(f) unless an element is expressly recited using the phrase "means for," or in the case of a method claim using the phrases "operation for" or "step for."

What is claimed is:

1. A mounting assembly for supporting card readers in an electronic equipment rack, wherein the equipment rack is configured to house therein the card readers and electronic equipment in communication with the card readers, the mounting assembly comprising:
    a bracket configured to couple to a frame of the equipment rack; and
    at least one mount configured to couple to a card reader, the at least one mount further configured to releasably couple to the bracket while the bracket is coupled to the frame of the equipment rack to thereby position the card reader, when coupled to the at least one mount, in the equipment rack;
    wherein the bracket defines at least one opening having a generally T shape for receiving the card reader and a cord of the card reader therein when the at least one mount is coupled to the bracket, such that the cord of the card reader extends through the at least one opening; and
    wherein the at least one opening of the bracket is configured to receive at least part of the at least one mount in the at least one opening when the at least one mount is coupled to the bracket.

2. The mounting assembly of claim 1, wherein the at least one opening includes three openings, whereby the mounting assembly is capable of supporting three card readers in the equipment rack.

3. The mounting assembly of claim 1, wherein the bracket defines at least one mounting hole adjacent the at least one opening, the at least one mount configured to releasably couple to the bracket, via at least one fastener, at the at least one mounting hole.

4. The mounting assembly of claim 3, wherein the at least one mount includes a first mount and the at least one mounting hole includes a first mounting hole;
    wherein the first mount includes an arm and a flange extending away from the arm, the arm configured to couple to the card reader, and the flange defining an opening configured to generally align with the first mounting hole of the bracket when the first mount is coupled to the bracket.

5. The mounting assembly of claim 4, wherein the bracket defines a generally forward surface and a generally rearward surface, a portion of the generally rearward surface engaging the frame of the rack when the bracket is coupled to the frame of the rack, and the flange of the first mount engaging the forward surface of the bracket when the first mount is coupled to the bracket.

6. The mounting assembly of claim 1, further comprising the equipment rack.

7. A mounting assembly for supporting card readers in a rack, wherein the rack is configured to house therein the card readers and electronic equipment in communication with the card readers, the mounting assembly comprising:
    a bracket defining at least one opening; and
    first and second mounts configured to extend through the at least one opening and to releasably couple to the bracket, each of the first and second mounts including an arm configured to couple to a card reader for positioning the card reader in the at least one opening of the bracket when the first and second mounts are coupled to the bracket, each of the first and second mounts including a flange extending away from the arm for coupling to the bracket;
    wherein the at least one opening of the bracket includes at least one cove portion configured to receive at least one cord associated with the card reader therein, when the card reader is positioned in the at least one opening, such that the at least one cord associated with the card reader extends through the at least one opening;
    wherein the at least one opening of the bracket includes a generally T shape and/or a generally L shape; and
    wherein the bracket is free of arms extending away from the bracket when the first and second mounts are uncoupled from the bracket.

8. The mounting assembly of claim 7, wherein the bracket defines first and second mounting holes, the first and second mounts each configured to releasably couple to the bracket, via at least one fastener, at a corresponding one of the first and second mounting holes.

9. The mounting assembly of claim 8, further comprising the at least one fastener; and
    wherein the at least one fastener includes a threaded fastener.

10. The mounting assembly of claim 8, wherein the flange of each of the first and second mounts defines an opening configured to generally align with a corresponding one of the first and second mounting holes of the bracket when the first and second mounts are coupled to the bracket.

11. The mounting assembly of claim 10, wherein the bracket defines a generally forward portion and a generally rearward portion, the flange of each of the first and second mounts engaging the forward portion of the bracket when the first and second mounts are coupled to the bracket; and
    wherein the bracket is configured to couple to a frame of the rack along a generally rearward portion of the bracket.

12. The mounting assembly of claim 7, wherein the at least one opening of the bracket includes multiple openings; and
    wherein the mounting assembly further comprises at least one additional mount configured to releasably couple to the bracket, the at least one additional mount configured to couple to another card reader for positioning the another card reader in another one of the openings defined by the bracket when the at least one additional mount is coupled to the bracket.

13. The mounting assembly of claim of claim 7, wherein the at least one opening includes at least three openings; and
   wherein the at least three openings are aligned generally longitudinally along the bracket.

14. A mounting assembly for supporting card readers in an electronic equipment rack, wherein the equipment rack is configured to house therein the card readers and electronic equipment in communication with the card readers, the mounting assembly comprising:
   a bracket configured to couple to a frame of the equipment rack; and
   first and second mounts, each configured to couple to a card reader and to releasably couple to the bracket and extend through at least one opening in the bracket, while the bracket is coupled to the frame of the equipment rack to thereby position the card reader, when coupled to the first and second mounts, in the equipment rack;
   wherein the at least one opening in the bracket is structured to receive at least one cord associated with the card reader through at least one cove portion of the at least one opening, when the first and second mounts are coupled to the card reader and are extending through the at least one opening in the bracket, such that the at least one cord extends through the at least one opening; and
   wherein the at least one opening of the bracket includes a generally T shape and/or a generally L shape.

15. The mounting assembly of claim 14, wherein the bracket defines at least one mounting hole adjacent the at least one opening, the first mount configured to releasably couple to the bracket, via at least one fastener, at the at least one mounting hole.

16. The mounting assembly of claim 15, wherein the at least one mounting hole includes a first mounting hole; and
   wherein the first mount includes an arm and a flange extending away from the arm, the arm configured to couple to the card reader and the flange defining an opening configured to generally align with the first mounting hole of the bracket when the first mount is coupled to the bracket.

17. The mounting assembly of claim 14, wherein the bracket is free of arms extending away from the bracket when the first and second mounts are uncoupled from the bracket.

* * * * *